United States Patent
Lu et al.

(10) Patent No.: US 11,380,717 B2
(45) Date of Patent: Jul. 5, 2022

(54) ARRAY SUBSTRATE AND MANUFACTURING METHOD THEREOF, FLEXIBLE DISPLAY PANEL

(71) Applicant: Wuhan China Star Optoelectronics Semiconductor Display Technology Co., Ltd., Wuhan (CN)

(72) Inventors: Rui Lu, Wuhan (CN); Yijia Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 365 days.

(21) Appl. No.: 16/613,118

(22) PCT Filed: Oct. 14, 2019

(86) PCT No.: PCT/CN2019/111106
§ 371 (c)(1),
(2) Date: Nov. 13, 2019

(87) PCT Pub. No.: WO2020/228235
PCT Pub. Date: Nov. 19, 2020

(65) Prior Publication Data
US 2021/0335846 A1    Oct. 28, 2021

(30) Foreign Application Priority Data

May 14, 2019   (CN) .......................... 201910397797.6

(51) Int. Cl.
*H01L 27/12*      (2006.01)
*H01L 27/32*      (2006.01)
*H01L 51/00*      (2006.01)

(52) U.S. Cl.
CPC ...... *H01L 27/1248* (2013.01); *H01L 27/1259* (2013.01); *H01L 27/3258* (2013.01);
(Continued)

(58) Field of Classification Search
CPC ....... H01L 27/1214–1296; H01L 27/32–3297; H01L 51/5253
See application file for complete search history.

(56) References Cited

U.S. PATENT DOCUMENTS

2005/0206304 A1*  9/2005  Kim ................... H01L 27/3276
                                                                    313/504
2007/0057260 A1*  3/2007  Lee .................... H01L 27/1248
                                                                    257/72
(Continued)

FOREIGN PATENT DOCUMENTS

CN          103364941        10/2013
CN          103700322        4/2014
(Continued)

*Primary Examiner* — Bryan R Junge (57) ABSTRACT

An array substrate includes a base substrate, at least one inorganic film layer, and at least one organic soft film layer. The organic soft film layer is disposed on a side of the inorganic film layer adjacent to the base substrate, and a side surface of the organic soft film layer adjacent to the inorganic film layer has a wavy shape. By using the inorganic film layer to generate a compressive stress on the organic soft film layer, the organic soft film layer is wavy, and the inorganic film layer is also wavy, which reduces the stress concentration of the panel when bending, and improves the bending performance of the flexible display panel.

11 Claims, 5 Drawing Sheets

(52) U.S. Cl.
CPC ...... *H01L 27/1218* (2013.01); *H01L 51/0097* (2013.01); *H01L 2251/5338* (2013.01)

(56) References Cited

U.S. PATENT DOCUMENTS

| | | | |
|---|---|---|---|
| 2013/0264595 A1* | 10/2013 | Hong | G02B 26/005 |
| | | | 257/91 |
| 2015/0263235 A1 | 9/2015 | Shin et al. | |
| 2016/0190221 A1 | 6/2016 | Cho et al. | |
| 2018/0366680 A1* | 12/2018 | Okigawa | H01L 27/3276 |

FOREIGN PATENT DOCUMENTS

| | | |
|---|---|---|
| CN | 104538425 | 4/2015 |
| CN | 105742316 | 7/2016 |
| CN | 110211969 | 9/2019 |

* cited by examiner

ARRAY SUBSTRATE AND MANUFACTURING METHOD THEREOF, FLEXIBLE DISPLAY PANEL

RELATED APPLICATIONS

This application is a National Phase of PCT Patent Application No. PCT/CN2019/111106 having International filing date of Oct. 14, 2019, which claims the benefit of priority of Chinese Patent Application No. 201910397797.6 filed on May 14, 2019. The contents of the above applications are all incorporated by reference as if fully set forth herein in their entirety.

FIELD AND BACKGROUND OF THE INVENTION

The present invention relates to the field of display technologies, and in particular, to an array substrate, a manufacturing method thereof, and a flexible display panel.

Organic light emitting diode (OLED) display devices have been widely used due to their advantages of self-luminescence, wide viewing angles, high contrast, low power consumption, fast response times, and flexibility. Flexible OLED display panels are more durable than ordinary rigid panels due to their flexibility. However, when a flexible OLED display panel is bent, stress occurs, which affects the bending performance.

Current flexible OLED display panels are generally composed of an array substrate, a luminescent material, and an encapsulation layer, and the above structures are mostly formed by stacking a metal film layer, an inorganic film layer, and an organic film layer. The inorganic film layer and the metal film layer generate a large stress when bent, especially the array substrate is usually superposed by a plurality of inorganic layers, which tends to cause stress concentration, thereby causing cracks in the display panel, affecting the bending performance, and thus affecting display.

SUMMARY OF THE INVENTION

The present invention provides an array substrate to solve technical problems of current flexible OLED display panels. Since the array substrate is provided with a plurality of inorganic film layers and metal film layers, and stresses of the inorganic film layers and the metal film layers are large, when the flexible OLED display panel is bent, stress concentration tends to occur, resulting in cracks in the flexible OLED display panel, affecting the bending performance, and thus affecting the display.

In order to solve the above problems, the technical solution provided by the present invention is as follows:

The present invention provides an array substrate comprising a base substrate, at least one inorganic film layer, and at least one organic soft film layer. The inorganic film layer is disposed on the base substrate, and the organic soft film layer is disposed on a side of the inorganic film layer adjacent to the base substrate. Wherein a side surface of the organic soft film layer adjacent to the inorganic film layer has a wavy shape.

In an embodiment of the present invention, the organic soft film layer is in contact with a side surface of the inorganic film layer adjacent to the base substrate.

In an embodiment of the present invention, the side surface of the inorganic film layer adjacent to the base substrate and another side surface opposite to the side surface of the inorganic film layer have a wavy shape.

In an embodiment of the present invention, the inorganic film layer is one or more of a buffer layer, a gate insulating layer, and an interlayer insulating layer in the array substrate.

In an embodiment of the present invention, the organic soft film layer is made of polyhexamethyldisiloxane or polyethylene glycol aluminum.

The present invention further provides a manufacturing method of an array substrate, comprising the following steps:

step S10: providing a base substrate, and forming an organic soft film layer on the base substrate; and step S20: forming an inorganic film layer on a surface of the organic soft film layer, wherein the inorganic film layer generates a compressive stress on the organic soft film layer, such that the compressive stress forms the organic soft film layer in a wavy shape.

In an embodiment of the present invention, the organic soft film layer is made of polyhexamethyldisiloxane or polyethylene glycol aluminum.

In an embodiment of the present invention, the side surface of the inorganic film layer adjacent to the base substrate and another side surface opposite to the side surface of the inorganic film layer have a wavy shape.

In an embodiment of the present invention, the inorganic film layer is one or more of a buffer layer, a gate insulating layer, and an interlayer insulating layer in the array substrate.

The present invention further provides a flexible display panel comprising an array substrate, a light emitting layer disposed on the array substrate, and an encapsulation layer disposed on the light emitting layer. The array substrate comprises a base substrate, an organic soft film layer, and an inorganic film layer which are sequentially disposed. Wherein a side surface of the organic soft film layer adjacent to the inorganic film layer has a wavy shape.

In an embodiment of the present invention, the organic soft film layer is in contact with a side surface of the inorganic film layer adjacent to the base substrate.

In an embodiment of the present invention, the side surface of the inorganic film layer adjacent to the base substrate and another side surface opposite to the side surface of the inorganic film layer have a wavy shape.

In an embodiment of the present invention, the inorganic film layer is one or more of a buffer layer, a gate insulating layer, and an interlayer insulating layer in the array substrate.

The beneficial effects of the invention: By adding an organic soft film layer under an inorganic film layer on an array substrate, a compressive stress generated on the organic soft film layer by the inorganic film layer causes an upper surface of the organic soft film layer having a wavy shape, and the inorganic film layer above it forms a wavy shape accordingly, which can reduce the stress concentration of the flexible display panel during bending. A stress generated by the inorganic film layer during bending can be slowly released by the below organic soft film layer, and the undulating wavy-shaped inorganic film layer is more favorable for bending, thereby improving the bending performance of the flexible display panel.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DESCRIPTION OF SPECIFIC EMBODIMENTS OF THE INVENTION

The following embodiments refer to the accompanying figures for exemplifying specific implementable embodiments of the present invention in a suitable computing environment. It should be noted that the exemplary described embodiments are configured to describe and understand the present invention, but the present invention is not limited thereto. Directional terms, such as an upper side, a lower side, a front side, a back side, a left side, a right side, an inner side, an outer side, and a lateral side, mentioned in the present invention are only for reference. Therefore, the directional terms are used for describing and understanding rather than limiting the present invention. In the figures, units having similar structures are used for the same reference numbers.

The present invention is directed to current flexible organic light emitting diode (OLED) display panels. Since an array substrate is provided with a plurality of inorganic film layers and metal film layers, and stresses of the inorganic film layers and the metal film layers are large, there are technical problems that when a flexible OLED display panel is bent, stress concentration tends to occur, resulting in cracks in the flexible OLED display panel, affecting the bending performance, and thus affecting a display. This embodiment can solve the defect.

Figure 1:
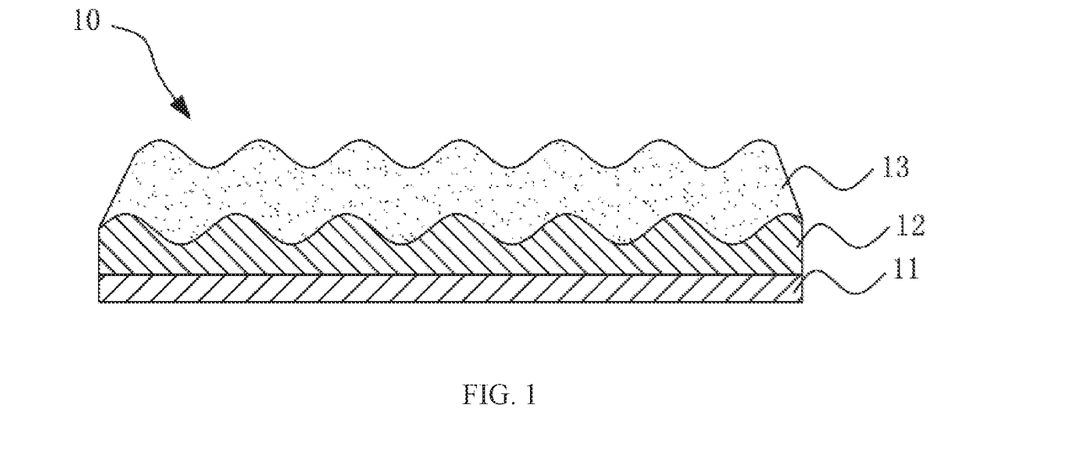
FIG. 1 is a schematic structural view of an array substrate of the present invention.

As shown in FIG. 1, the present invention provides an array substrate 10 comprising a base substrate 11, at least one inorganic film layer 13, and at least one organic soft film layer 12. The inorganic film layer 13 is disposed on the base substrate 11. The organic soft film layer 12 is disposed on a side of the inorganic film layer 13 adjacent to the base substrate 11, and a side surface of the organic soft film layer 12 adjacent to the inorganic film layer 13 has a wavy shape.

Specifically, the organic soft film layer 12 is disposed on the base substrate 11, and the inorganic film layer 13 is disposed on the organic soft film layer 12. The organic soft film layer 12 is in contact with a side surface of the inorganic film layer 13 adjacent to the base substrate 11.

The side surface of the inorganic film layer 13 adjacent to the base substrate 11 and another side surface opposite to the side surface of the inorganic film layer 13 have a wavy shape corresponding to the shape of the organic soft film layer 12.

The organic soft film layer 12 is made of polyhexamethyldisiloxane or polyethylene glycol aluminum.

There is a stress difference between the inorganic film layer 13 and the organic soft film layer 12. After the organic soft film layer 12 is deposited on the base substrate 11, a surface of the organic soft film layer 12 is flat. When the inorganic film layer 13 is deposited on the surface of the organic soft film layer 12, the inorganic film layer 13 generates a compressive stress on the organic soft film layer 12, so that the organic soft film layer 12 spontaneously forms a wavy structure. The inorganic film layer 13 shrinks and forms a wavy shape during the film formation process accordingly.

The array substrate 10 needs to be bent when applied to a flexible display panel. However, a plurality of the inorganic film layer 13 are covered on the base substrate 11 in the array substrate 10, and each of the inorganic film layers 13 has no place to release stresses, resulting in cracks when bent. By providing the organic soft film layer 12 under the inorganic film layer 13, the stresses generated by the bending can be effectively released, thereby improving the bending effect of the flexible display panel of the OLED.

The inorganic film layer 13 is one or more of a buffer layer, a gate insulating layer, and an interlayer insulating layer in the array substrate. Since these film layers are made of an inorganic material, the stresses received during bending is large, so that the organic soft film layer 12 can be disposed under the buffer layer, the gate insulating layer, and the interlayer insulating layer, thereby further releasing the stresses.

Figure 3:
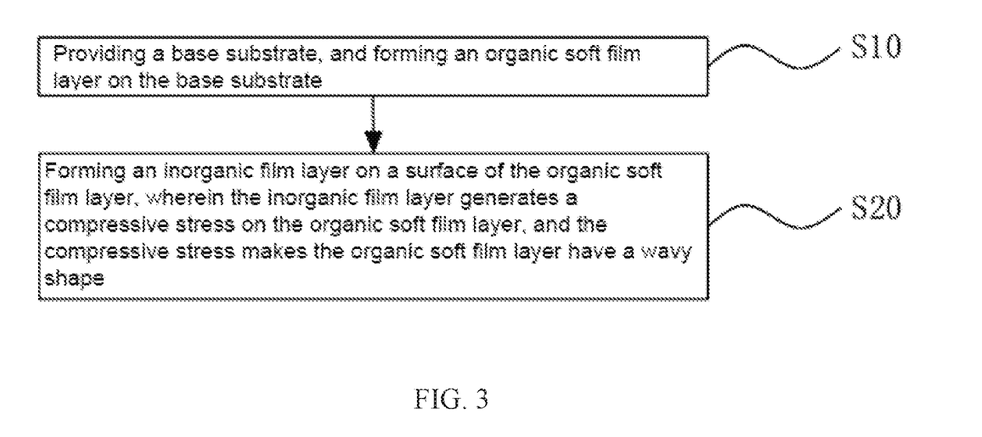
FIG. 3 is a flowchart showing steps of a manufacturing method for preparing a flexible display panel of the present invention.

As shown in FIG. 3, the present invention further provides a manufacturing method for the above array substrate 10, which comprises the following steps:

step S10: providing a base substrate 11, and forming an organic soft film layer 12 on the base substrate 11; and step S20: forming an inorganic film layer 13 on a surface of the organic soft film layer 12, wherein the inorganic film layer 13 generates a compressive stress on the organic soft film layer 12, such that the compressive stress forms the organic soft film layer 20 in a wavy shape.

The base substrate 11 may be a flexible substrate, such as a polyimide substrate, on which a thin film transistor device is manufactured, such as a source-drain electrode and a gate electrode.

First, an organic soft film material, such as polyhexamethyldisiloxane or polyethylene glycol, is deposited on the base substrate 11. The organic soft film material has less stress and spontaneously forms a wavy shape when subjected to a compressive stress.

Thereafter, at least one inorganic material, such as one or more of silicon nitride, silicon oxide or silicon oxynitride, is deposited on a surface of the organic soft film material by plasma enhanced chemical vapor deposition (PECVD). Under the compressive stress of the inorganic material, the below organic soft film material has a wavy deformation to form the organic soft film layer 12, and the upper inorganic material has a wavy deformation to form the inorganic film layer 13.

The present invention further provides a flexible display panel comprising the above array substrate 10. The flexible display panel further comprises a light emitting layer disposed on the array substrate 10, and an encapsulation layer disposed on the light emitting layer.

Hereinafter, the above array substrate, a manufacturing method thereof, and a flexible display panel will be described with reference to specific embodiments.

First Embodiment

Figure 2:
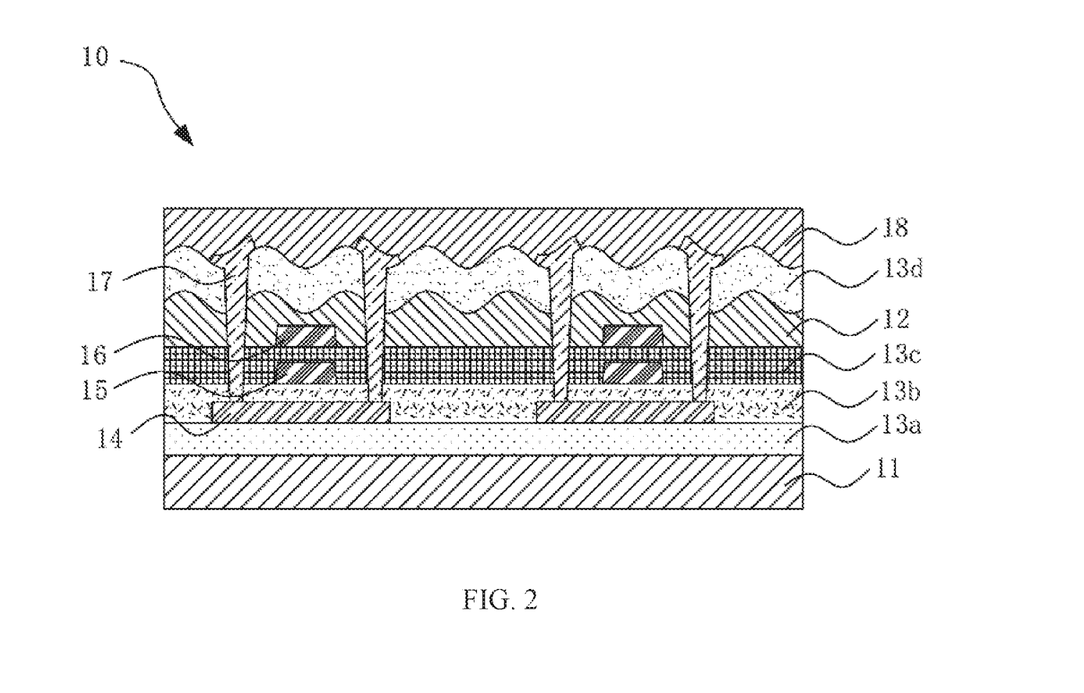
FIG. 2 is a schematic structural view of the array substrate according to a first embodiment.

As shown in FIG. 2, the array substrate 10 comprises a base substrate 11, a buffer layer 13a, an active layer 14, a first gate insulating layer 13b, a first gate layer 15, a second gate insulating layer 13c, a second gate layer 16, an organic soft film layer 12, an interlayer insulating layer 13d, a source/drain layer 17, and a flat layer 18.

The base substrate 11 is a flexible substrate, and the base substrate 11 may be a single layer or a multilayer structure. The base substrate 11 is formed by coating and curing steps of organic substances.

The buffer layer 13a is made of an inorganic material such as silicon nitride or silicon oxide, and can be manufactured by a PECVD process. The buffer layer 13a functions to protect the base substrate 11.

The material of the active layer 14 is polysilicon, which can be manufactured by a PECVD process.

The first gate layer 15 is used to form a gate electrode, and the second gate layer 16 is used to form a capacitor and a part of a driving circuit trace. The first gate layer 15 and the second gate layer 16 are all prepared by a physical vapor deposition method or a sputtering method using a metal material.

The first gate insulating layer 13b covers the active layer 14, and the second gate insulating layer 13c covers the first gate layer 15. The material of the first gate insulating layer 13b and the second gate insulating layer 13c is one of silicon nitride or silicon oxide, and can be manufactured by a chemical vapor deposition method.

The interlayer insulating layer 13d, the organic soft film layer 12, the second gate insulating layer 13c, and the first gate insulating layer 13a are each provided with a via hole for a source electrode or a drain electrode on the source/drain layer 17 is in contact with the active layer to form an electrical connection.

The material of the interlayer insulating layer 13d is an inorganic material such as silicon nitride, silicon oxide or silicon oxynitride, which can be manufactured by a PECVD process.

The interlayer insulating layer 13d has a thick film thickness, and the film thickness is about 2 to 4 times that of the lower gate insulating layer. The thicker the thickness of the inorganic film layer, the more easily the stresses received at the time of bending is concentrated, thereby generating cracks, so that the organic soft film layer 12 is disposed below the interlayer insulating layer 13d for slow release stresses.

The material of the organic soft film layer 12 is one of polyhexamethyldisiloxane and polyethylene glycol aluminum.

The surface of the organic soft film layer 12 adjacent to the interlayer insulating layer 13d has a wavy shape, and the stresses of the organic soft film layer 12 is small. When the material of the interlayer insulating layer 13 is deposited on the surface of the organic soft film layer 12, since the organic soft film layer 12 is subjected to the compressive stress of the upper film layer, wavy deformation occurs, the upper surface spontaneously forms a wavy shape structure, and the interlayer insulating layer 13 above it forms a wavy shape accordingly. The below organic soft film layer 12 shares a part of the stresses when the interlayer insulating layer 13 is in the wavy process, and reduce the stress concentration condition during bending, thereby improving the bending effect. In addition, the wavy interlayer insulating layer 13 can have sufficient space to relieve the stresses generated during bending.

The material of the flat layer 18 is an organic material, which provides a flat surface for the subsequent manufactured of the light emitting layer. The flat layer 18 covers a surface of the wavy interlayer insulating layer 13d, and is also beneficial for slowly releasing the stresses generated by the bending.

Figure 4:
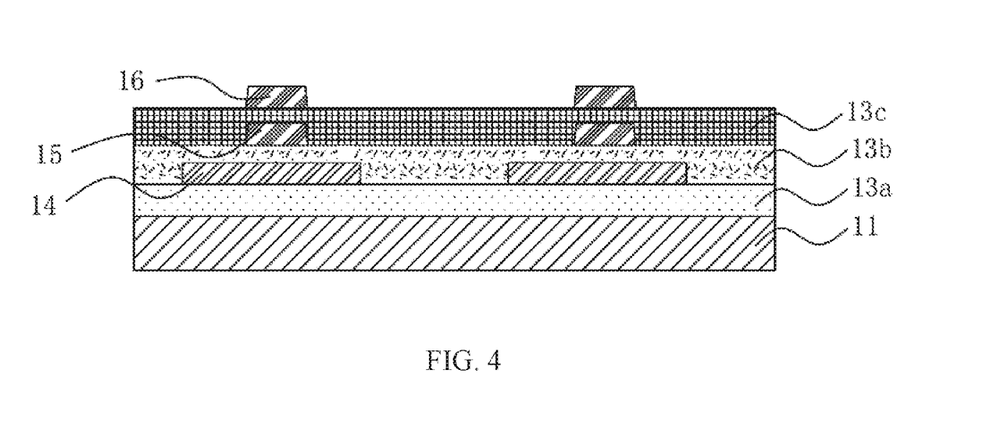
FIGS. 4, 5 and 6 are structural schematic views of a manufacturing process of the array substrate according to the first embodiment.
Figure 5:
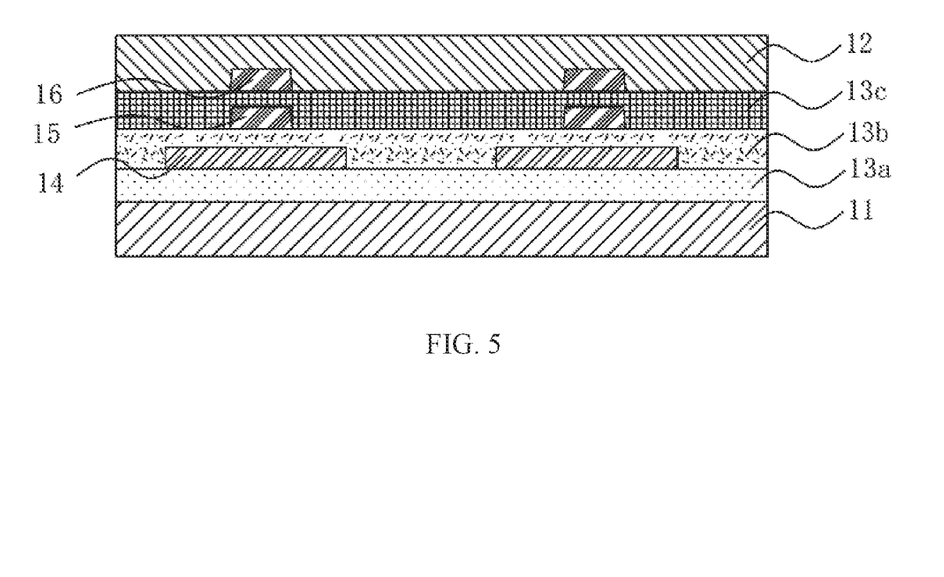
Figure 6:
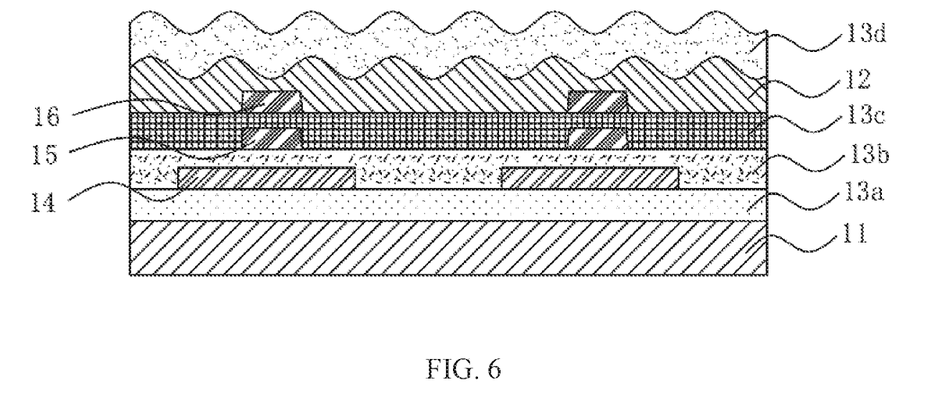

As shown in FIG. 4 to FIG. 6, the embodiment further provides a manufacturing method for the above array substrate 10, which comprises:

step S10: providing a base substrate 11, and forming an organic soft film layer 12 on the base substrate 11; and step S20: forming an inorganic film layer 13 on a surface of the organic soft film layer 12, wherein the inorganic film layer 13 generates a compressive stress on the organic soft film layer 12, such that the compressive stress forms the organic soft film layer 12 in a wavy shape.

Specifically, a buffer layer 13a, an active layer 14, a first gate insulating layer 13b, a first gate layer 15, a second gate insulating layer 13c, and a second gate layer 16 are manufactured on the base substrate 11.

After the manufacturing process of the second gate layer 16 is completed, a material of the organic soft film layer 12 is deposited on the second gate insulating layer 13c by PECVD or physical vapor deposition, and then the material of the interlayer insulating layer 13d is deposited on the inorganic soft film layer 12. The interlayer insulating layer 13d is disposed on the inorganic soft film layer 12.

A stress of the material of the organic soft film layer 12 is less than a stress of the material of the interlayer insulating layer 13d. The organic soft film layer 12 spontaneously forms a wavy structure after being subjected to a compressive stress of the interlayer insulating layer 13d, and the interlayer insulating layer 13d forms a wavy structure accordingly.

Specifically, a surface of the organic soft film layer 12 adjacent to the interlayer insulating layer 13d has a wavy shape, and a side surface of the interlayer insulating layer 13d adjacent to the base substrate and another side surface opposite to the side surface of the interlayer insulating layer 13d have a wavy shape.

Wherein, the material of the organic soft film layer 12 is one of polyhexamethyldisiloxane and polyethylene glycol aluminum.

The interlayer insulating layer 13d may be a two-layer or multi-layer structure. The material of the interlayer insulating layer 13d is one of silicon nitride, silicon oxide, and silicon oxynitride.

Thereafter, via holes are formed on the wavy interlayer insulating layer 13d by processes such as exposure, development, etching, etc., so that the subsequently manufactured source/drain layer 17 is connected to the active layer 14.

In other embodiments, the organic soft film layer 12 may also be disposed under other inorganic film layers 13. The inorganic film layer 13 may be a buffer layer 13a, a first gate insulating layer 13b, a second gate insulating layer 13c, and the like.

Figure 7:
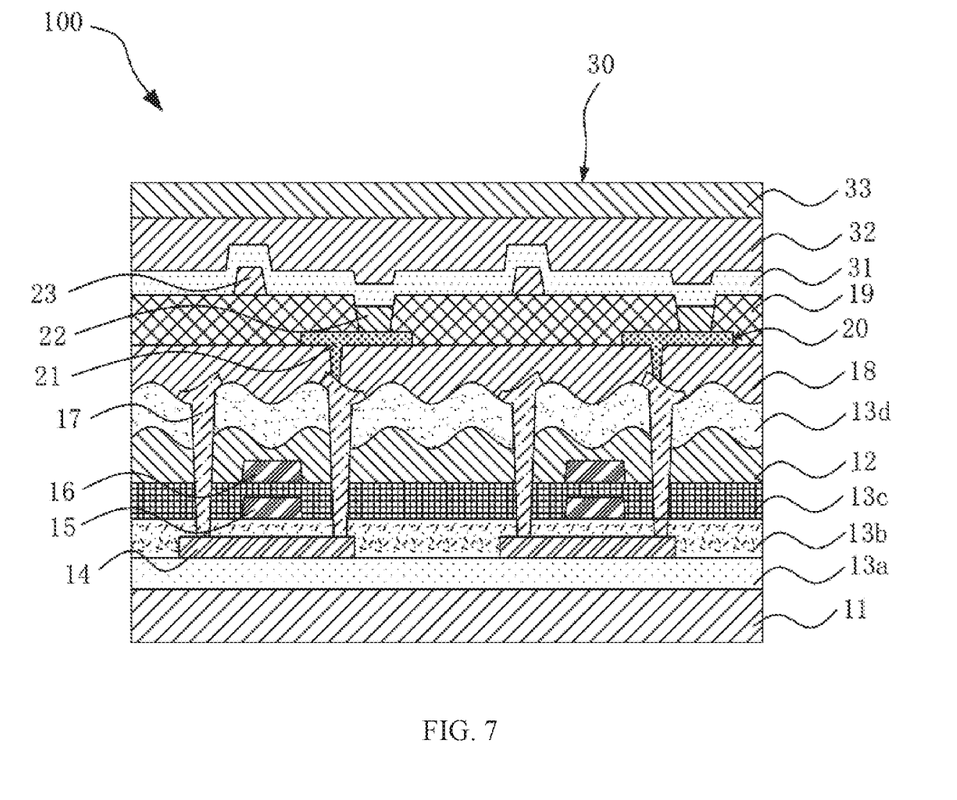
FIG. 7 is a schematic structural view of a flexible display panel according to the first embodiment.

As shown in FIG. 7, the embodiment further provides a flexible display panel 100. The flexible display panel comprises the array substrate 10, a light emitting layer 20 disposed on the array substrate 10, and an encapsulation layer 30 disposed on the light emitting layer 20.

The light emitting layer 20 comprises an anode layer 21 and an organic light emitting material layer 22 disposed in sequence. The anode layer 21 is disposed on the flat layer 18, and the organic light emitting material layer 22 is disposed on the anode layer 21.

A pixel defining layer 19 is further disposed on the flat layer 18, and the pixel defining layer 19 is provided with a plurality of openings for accommodating the organic light emitting material layer 22.

The pixel defining layer 19 is provided with a supporting pad 23, and the supporting pad 23 plays a supporting role to prevent the mask from scratching the organic light emitting material layer 22 when the organic light emitting material is evaporated.

Wherein the pixel defining layer 19 and the support pad 23 are both organic film layers, which can be coated and cured to form.

The encapsulation layer 30 covers the light emitting layer 20 to prevent water and oxygen from affecting the performance of the flexible light emitting device.

The encapsulation layer 30 comprises a first inorganic encapsulation layer 31, an organic encapsulation layer 32, and a second inorganic encapsulation layer 33 which are sequentially stacked. The first inorganic encapsulating layer 31 and the second inorganic encapsulating layer 33 function to block water oxygen. The organic encapsulating layer 32 functions as a sustained release stress and encapsulates foreign matter. Although the inorganic encapsulation layer of the encapsulation layer 30 is thick, the intermediate organic encapsulation layer 32 can relieve stresses and is easy to realize bending.

The first inorganic encapsulation layer 31 and the second inorganic encapsulation layer 33 are one or a combination of silicon nitride, silicon oxide, silicon oxynitride, and aluminum oxide. The organic encapsulation layer 32 is polyhexamethyldisiloxane or acrylic acid.

The specific structure of the array substrate 10 in the flexible display panel 100 is the same as that of the above embodiment, and details are not described herein again.

Second Embodiment

Figure 8:
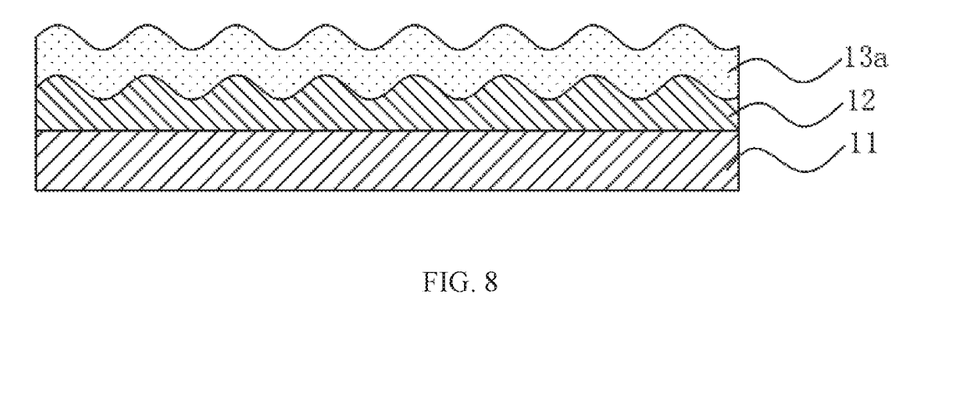
FIG. 8 is a schematic structural view of the array substrate according to a second embodiment.

As shown in FIG. 8, different from the first embodiment, the organic soft film layer 12 in this embodiment may be disposed below the buffer layer 13a to wavy the structure of the buffer layer 13a. The organic soft film layer 12 is disposed on a surface of the base substrate 11, and the buffer layer 13a is disposed on a surface of the organic soft film layer 12.

An upper surface of the organic soft film layer 12 has wavy shape under a compressive stress of the upper film layer. Accordingly, an upper surface and a lower surface of the buffer layer 13a also form a wavy structure. Thereafter, the active layer formed on the buffer layer 13a and a lower surface of the first gate insulating layer are also wavy, which is more favorable for bending.

Other structures of this embodiment are the same as those in the first embodiment, and details are not described herein again.

Third Embodiment

Figure 9:
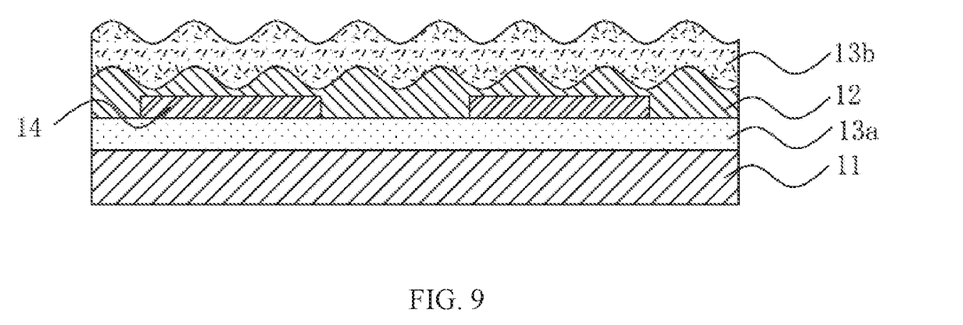
FIG. 9 is a schematic structural view of the array substrate according to a third embodiment.

As shown in FIG. 9, different from the first embodiment, the organic soft film layer 12 in this embodiment may be disposed under the first gate insulating layer 13b, and the structure of the first gate insulating layer 13b may be wavy. The organic soft film layer 12 is disposed on the active layer 14, and the first gate insulating layer 13b is disposed on a surface of the organic soft film layer 12.

An upper surface of the organic soft film layer 12 has wavy shape under a compressive stress of the upper film layer. Accordingly, an upper surface and a lower surface of the first gate insulating layer 13b also form a wavy structure. Thereafter, a lower surface of the second gate insulating layer formed on the first gate insulating layer 13b is also wavy, which is more favorable for bending.

The organic soft film layer 12 is disposed between the buffer layer 13a and the first gate insulating layer 13b, and can simultaneously release the stresses generated by the upper and lower inorganic film layers when the upper and lower inorganic film layers are bent.

The other structures in this embodiment are the same as those in the first embodiment, and details are not described herein again.

Beneficial effects: By adding an organic soft film layer under an inorganic film layer on an array substrate, a compressive stress generated on the organic soft film layer by the inorganic film layer causes an upper surface of the organic soft film layer having a wavy shape, and the inorganic film layer above it forms a wavy shape accordingly, which can reduce the stress concentration of the flexible display panel during bending. The stresses generated by the inorganic film layer during bending can be slowly released by the below organic soft film layer, and the undulating wavy-shaped inorganic film layer is more favorable for bending, thereby improving the bending performance of the flexible display panel.

In the above, various other corresponding changes and modifications can be made according to the technical solutions and technical ideas of the present invention to those skilled in the art, and all such changes and modifications are within the scope of the claims of the present invention.

What is claimed is:

1. An array substrate, comprising:
   a base substrate;
   at least one inorganic film layer disposed on the base substrate; and
   at least one organic soft film layer disposed on a side of the inorganic film layer adjacent to the base substrate;
   wherein a side surface of the organic soft film layer adjacent to the inorganic film layer has a wavy shape, and the organic soft film layer is made of polyhexamethyldisiloxane or polyethylene glycol aluminum.

2. The array substrate as claimed in claim 1, wherein the organic soft film layer is in contact with a side surface of the inorganic film layer adjacent to the base substrate.

3. The array substrate as claimed in claim 2, wherein the side surface of the inorganic film layer adjacent to the base substrate and another side surface opposite to the side surface of the inorganic film layer have a wavy shape.

4. The array substrate as claimed in claim 3, wherein inorganic film layer is one or more of a buffer layer, a gate insulating layer, and an interlayer insulating layer in the array substrate.

5. A manufacturing method of an array substrate, comprising the following steps:
   step S10: providing a base substrate, and forming an organic soft film layer on the base substrate; and
   step S20: forming an inorganic film layer on a surface of the organic soft film layer, wherein the inorganic film layer generates a compressive stress on the organic soft film layer, such that the compressive stress forms the organic soft film layer in a wavy shape, wherein the organic soft film layer is made of polyhexamethyldisiloxane or polyethylene glycol aluminum.

6. The manufacturing method as claimed in claim 5, wherein the first sub-blocking portion is made of polyimide, and the second sub-blocking portion and the third sub-blocking portion are both made of photosensitive resin.

7. The manufacturing method as claimed in claim 5, wherein the inorganic film layer is one or more of a buffer layer, a gate insulating layer, and an interlayer insulating layer in the array substrate.

8. A flexible display panel, comprising:
- an array substrate comprising a base substrate, an organic soft film layer, and an inorganic film layer which are sequentially disposed;
- a light emitting layer disposed on the array substrate; and
- an encapsulation layer disposed on the light emitting layer;
- wherein a side surface of the organic soft film layer adjacent to the inorganic film layer has a wavy shape, and the organic soft film layer is made of polyhexamethyldisiloxane or polyethylene glycol aluminum.

9. The flexible display panel as claimed in claim 8, wherein the organic soft film layer is in contact with a side surface of the inorganic film layer adjacent to the base substrate.

10. The flexible display panel as claimed in claim 9, wherein the side surface of the inorganic film layer adjacent to the base substrate and another side surface opposite to the side surface of the inorganic film layer have a wavy shape.

11. The flexible display panel as claimed in claim 10, wherein the inorganic film layer is one or more of a buffer layer, a gate insulating layer, and an interlayer insulating layer in the array substrate.

* * * * *